(12) United States Patent
Lin et al.

(10) Patent No.: US 9,639,419 B2
(45) Date of Patent: May 2, 2017

(54) READ VOLTAGE LEVEL ESTIMATING METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Tien-Ching Wang, Kaohsiung (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 73 days.

(21) Appl. No.: 14/745,472

(22) Filed: Jun. 22, 2015

(65) Prior Publication Data

US 2016/0306693 A1 Oct. 20, 2016

(30) Foreign Application Priority Data

Apr. 14, 2015 (TW) .............................. 104111851 A

(51) Int. Cl.
*H03M 13/09* (2006.01)
*G06F 11/10* (2006.01)
*G11C 29/02* (2006.01)
*G11C 29/44* (2006.01)
*G11C 29/50* (2006.01)

(52) U.S. Cl.
CPC ........ *G06F 11/1048* (2013.01); *G11C 29/021* (2013.01); *G11C 29/028* (2013.01); *G11C 29/44* (2013.01); *G11C 2029/5004* (2013.01)

(58) Field of Classification Search
CPC .................................................. H03M 13/091

USPC .................................... 714/757, 733, 755, 24
See application file for complete search history.

(56) References Cited

U.S. PATENT DOCUMENTS

| 8,116,141 | B2 * | 2/2012 | Yoo ..................... | G11C 16/3427 365/185.02 |
| 8,149,621 | B2 * | 4/2012 | Kim ....................... | G11C 29/12 365/185.09 |
| 8,644,099 | B2 * | 2/2014 | Cometti ................. | G11C 16/10 365/185.18 |

(Continued)

OTHER PUBLICATIONS

"Office Action of Taiwan Counterpart Application", issued on Nov. 29, 2016, p. 1-p. 6.

*Primary Examiner* — Fritz Alphonse
(74) *Attorney, Agent, or Firm* — Jianq Chyun IP Office

(57) ABSTRACT

A read voltage level estimating method, a memory storage device and a memory control circuit unit are provided. The method includes: reading a first region of a rewritable non-volatile memory module according to a first read voltage level to obtain a first encoding unit which belongs to a block code; performing a first decoding procedure on the first encoding unit and recording first decoding information; reading the first region according to a second read voltage level to obtain a second encoding unit which belongs to the block code; performing a second decoding procedure on the second encoding unit and recording second decoding information; and estimating and obtaining a third read voltage level according to the first decoding information and the second decoding information. Accordingly, a management ability of the rewritable non-volatile memory module adopting the block code may be improved.

36 Claims, 9 Drawing Sheets

(56) References Cited

U.S. PATENT DOCUMENTS

2012/0239976 A1* 9/2012 Cometti ................. G11C 16/26
                                                        714/24
2014/0226412 A1* 8/2014 Yeh ..................... G11C 11/5628
                                                      365/185.21
2015/0085573 A1    3/2015 Sharon et al.

* cited by examiner

READ VOLTAGE LEVEL ESTIMATING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 104111851, filed on Apr. 14, 2015. The entirety of the above-mentioned patent application is hereby incorporated by reference herein and made a part of this specification.

BACKGROUND

Technical Field

The invention relates a memory management method, and more particularly, relates to a read voltage level estimating method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, in order to ensure a correctness of specific data, the data is encoded before writing it into the rewritable non-volatile memory module. The encoded data is then written into the rewritable non-volatile memory module. If that data is to be read, the encoded data is read and decoded. If the data can be successfully decoded, it means that there is only a small number of error bits, and those error bits can be corrected. However, if the data cannot be successfully decoded (i.e., the decoding fails), a different read voltage may be used to re-read the data. Nonetheless, under certain circumstances, the read data can still not be successfully decoded even if all the available read voltages have been used, resulting in a data read failure. Particularly, this data read failure becomes worse in the case where a block code is used for encoding.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a read voltage level estimating method, a memory storage device and a memory control circuit unit, which are capable of improving a management capability of a rewritable non-volatile memory module adopting a block code.

An exemplary embodiment of the invention provides a read voltage level estimating method for a rewritable non-volatile memory module, and the read voltage level estimating method includes: reading a first region of the rewritable non-volatile memory module according to a first read voltage level to obtain a first encoding unit, wherein the first encoding unit belongs to a block code; performing a first decoding procedure on the first encoding unit and recording first decoding information; reading the first region according to a second read voltage level to obtain a second encoding unit, wherein the second encoding unit belongs to the block code; performing a second decoding procedure on the second encoding unit and recording second decoding information; and estimating and obtaining a third read voltage level according to the first decoding information and the second decoding information.

Another exemplary embodiment of the invention provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit is configured to send a first read command sequence. The first read command sequence is configured to instruct reading a first region of the rewritable non-volatile memory module according to a first read voltage level to obtain a first encoding unit. The first encoding unit belongs to a block code. The memory control circuit unit is further configured to perform a first decoding procedure on the first encoding unit and record first decoding information. The memory control circuit unit is further configured to send a second read command sequence. The second read command sequence is configured to instruct reading the first region according to a second read voltage level to obtain a second encoding unit. The second encoding unit belongs to the block code. The memory control circuit unit is further configured to perform a second decoding procedure on the second encoding unit and record second decoding information. The memory control circuit unit is further configured to estimate and obtain a third read voltage level according to the first decoding information and the second decoding information.

According to another exemplary embodiment of the invention, a memory control circuit unit is provided and configured to control a rewritable non-volatile memory module. The memory control circuit unit includes a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface, and the error checking and correcting circuit. The memory management circuit is configured to send a first read command sequence. The first read command sequence is configured to instruct reading a first region of the rewritable non-volatile memory module according to a first read voltage level to obtain a first encoding unit. The first encoding unit belongs to a block code. The error checking and correcting circuit is configured to perform a first decoding procedure on the first encoding unit and the memory management circuit is further configured to record first decoding information. The memory management circuit is further configured to send a second read command sequence. The second read command sequence is configured to instruct reading the first region according to a second read voltage level to obtain a second encoding unit. The second encoding unit belongs to the block code. The error checking and correcting circuit is further configured to perform a second decoding procedure on the second encoding unit and the memory management circuit is further configured to record second decoding information. The memory management circuit is further configured to estimate and obtain a third read voltage level according to the first decoding information and the second decoding information.

Based on the above, after reading the memory by using the different read voltage levels and attempting to decode the obtained data, the decoding information corresponding to the different encoding procedures are recorded. Later, the decoding information may be used as a reference to estimate for one suitable read voltage level. Accordingly, a management ability of the rewritable non-volatile memory module adopting the block code may be improved.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
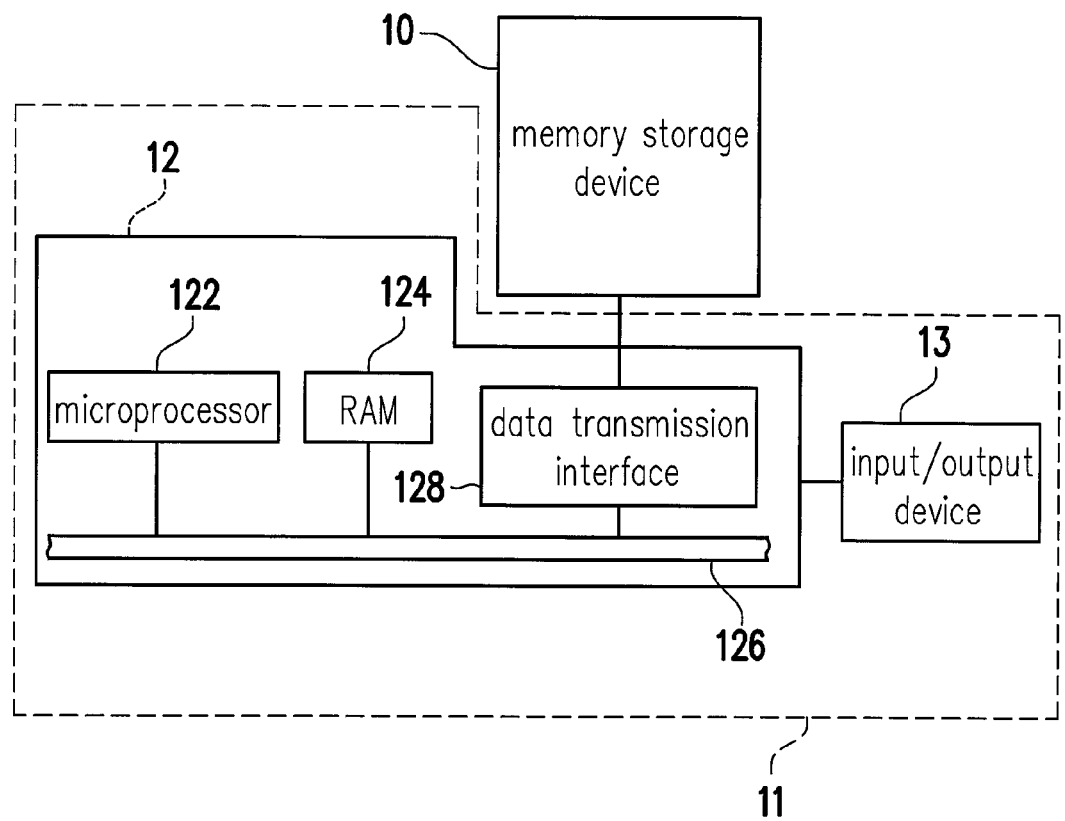
FIG. 1 is a schematic diagram illustrating a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 2:
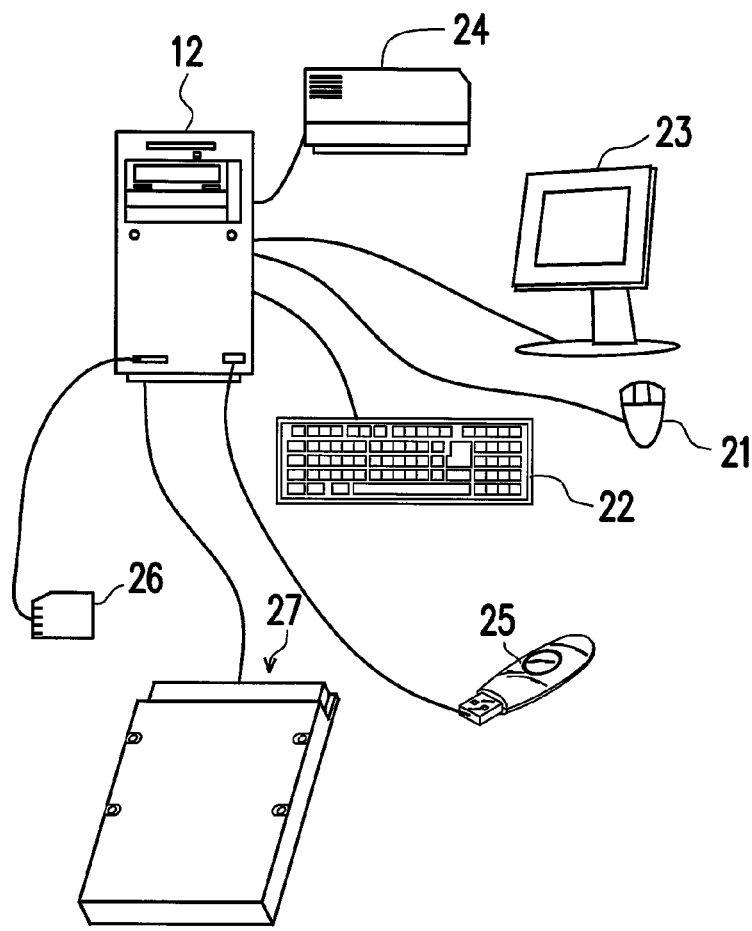
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 11 includes a computer 12 and an input/output (I/O) device 13. The computer 12 includes a microprocessor 122, a random access memory (RAM) 124, a system bus 126, and a data transmission interface 128. For example, the I/O device 13 includes a mouse 21, a keyboard 22, a display 23 and a printer 24 as shown in FIG. 2. It should be understood that the devices illustrated in FIG. 2 are not intended to limit the I/O device 13, and the I/O device 13 may further include other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
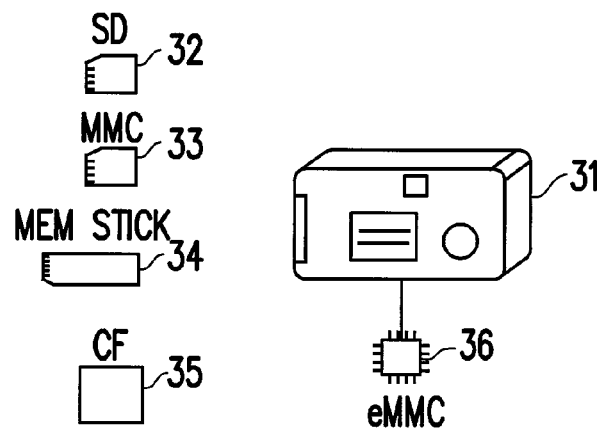
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may substantially be any system capable of storing data with the memory storage device 10. Even though the host system 11 is illustrated as a computer system in the present exemplary embodiment, however, in another exemplary embodiment of the present invention, the host system 11 may be a digital camera, a video camera, a telecommunication device, an audio player, or a video player. For example, if the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 includes an embedded MMC (eMMC). It should be mentioned that the eMMC is directly coupled to a substrate of the host system.

Figure 4:
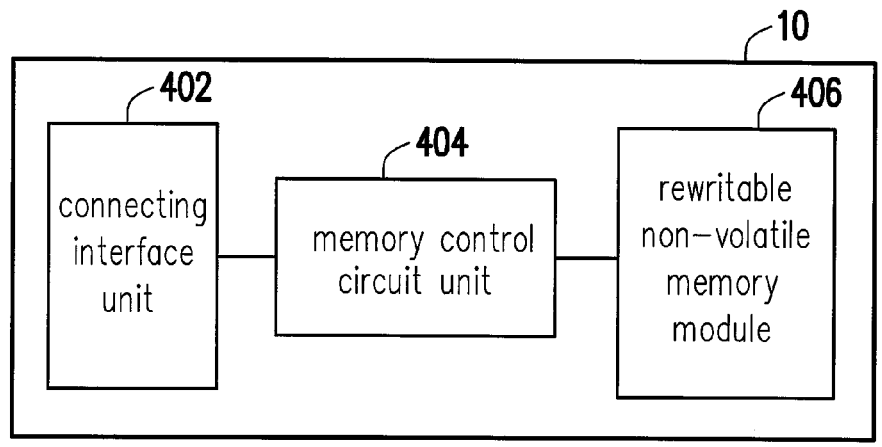
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a serial advanced technology attachment (SATA) standard. However, the invention is not limited thereto, and the connection interface unit 402 may also be compatible to a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and execute operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a Single Level Cell (SLC) NAND flash memory module (i.e., a flash memory module capable of storing one bit data in one memory cell), a Multi Level Cell (MLC) NAND flash memory module (i.e., a flash memory module capable of storing two bit data in one memory cell), a Triple Level Cell (TLC) NAND flash memory module (i.e., a flash memory module capable of storing three bit data in one memory cell), other flash memory modules or any memory module having the same features.

Figure 5:
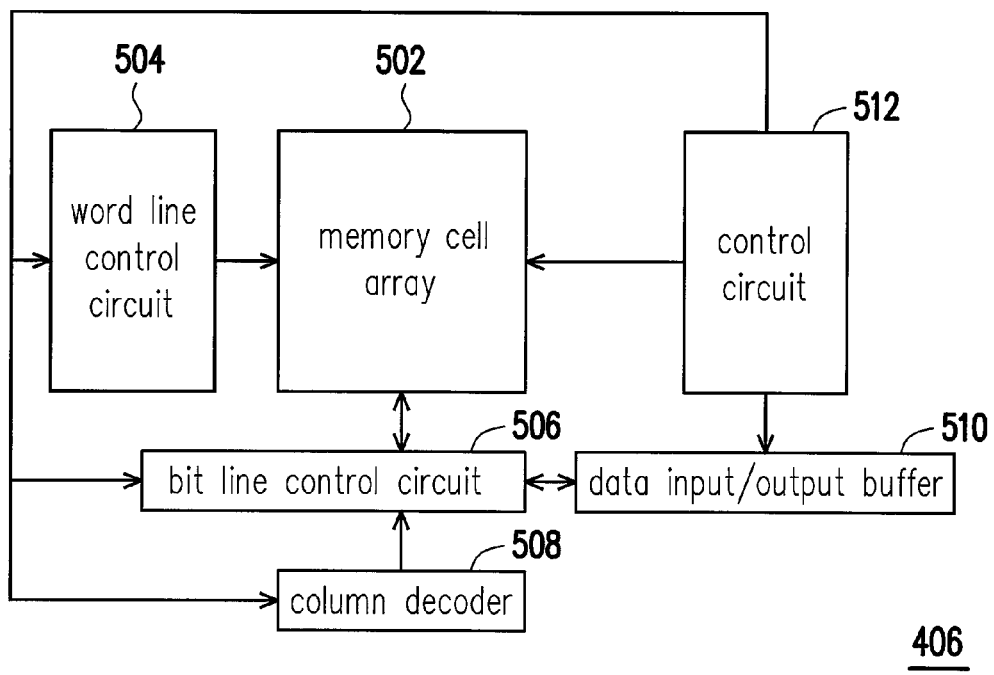
FIG. 5 is a schematic block diagram illustrating a rewritable non-volatile memory module according to an exemplary embodiment of the invention.
Figure 6:
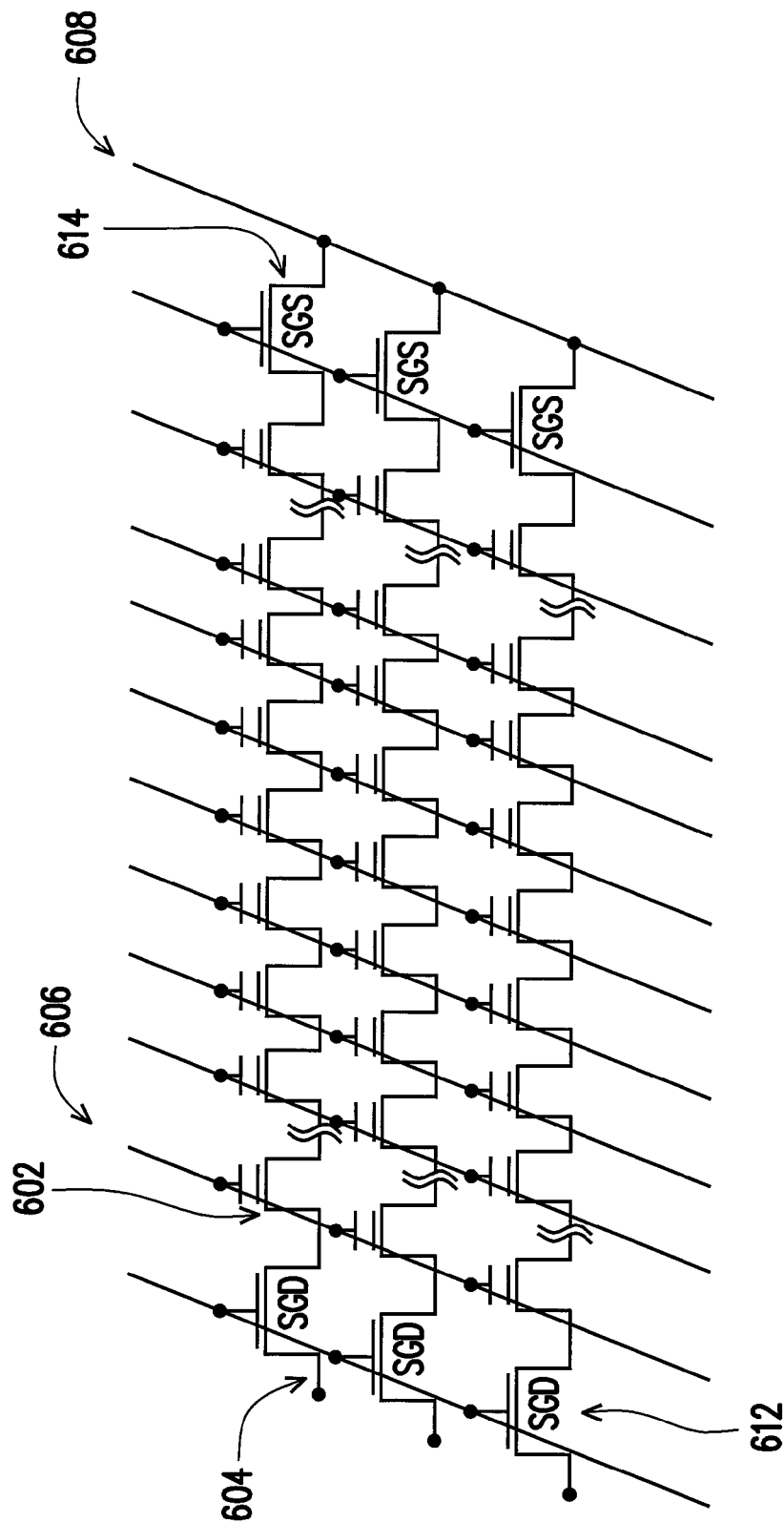
FIG. 6 is a schematic diagram illustrating a memory cell array according to an exemplary embodiment of the invention.

FIG. 5 is a schematic block diagram illustrating a rewritable non-volatile memory module according to an exemplary embodiment of the invention. FIG. 6 is a schematic diagram illustrating a memory cell array according to an exemplary embodiment of the invention.

Referring to FIG. 5, the rewritable non-volatile memory module 406 includes a memory cell array 502, a word line control circuit 504, a bit line control circuit 506, a column decoder 508, a data input/output buffer 510 and a control circuit 512.

In the present exemplary embodiment, the memory cell array 502 may include a plurality of memory cells 602 used to store data, a plurality of select gate drain (SGD) transistors 612, a plurality of select gate source (SGS) transistors 614, as well as a plurality of bit lines 604, a plurality of word lines 606, a common source line 608 connected to the memory cells (as shown in FIG. 6). The memory cell 602 is disposed at intersections of the bit lines 604 and the word lines 606 in a matrix manner (or in a 3D stacking manner). If a write command or a read command is received from the memory control circuit unit 404, the control circuit 512 controls the word line control circuit 504, the bit line control circuit 506, the column decoder 508, the data input/output buffer 510 to write the data into the memory cell array 502 or read the data from the memory cell array 502, wherein the word line control circuit 504 is configured to control voltages applied to the word lines 606, the bit line control circuit 506 is configured to control voltages applied to the bit lines 604, the column decoder 508 is configured to select the corresponding bit line according to a row address in a command, and the data input/output buffer 510 is configured to temporarily store the data.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell." Each of the memory cells in the memory cell array 502 has a plurality of storage statuses depended on changes in the threshold voltage. Moreover, which of the storage statuses the memory cell belongs to may be determined by applying read voltages, so as to obtain the one or more bits stored in the memory cell.

Figure 7:
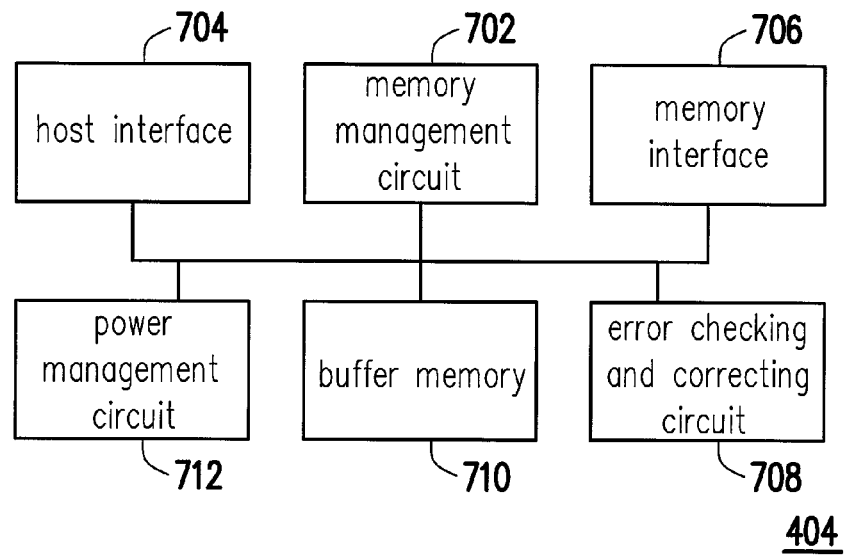
FIG. 7 is a schematic block diagram illustrating a memory control circuit unit according to an exemplary embodiment of the invention.

FIG. 7 is a schematic block diagram illustrating a memory control circuit unit according to an exemplary embodiment of the invention.

Referring to FIG. 7, the memory control circuit unit 404 includes a memory management circuit 702, a host interface 704, a memory interface 706 and an error checking and correcting circuit 708.

The memory management circuit 702 is configured to control overall operations of the memory control circuit unit 404. Specifically, the memory management circuit 702 has a plurality of control commands. During operations of the memory storage device 10, the control commands are executed to execute various operations such as writing, reading and erasing data. Hereinafter, operations of the memory management circuit 702 are described as equivalent to describe operations of the memory control circuit unit 404.

In the present exemplary embodiment, the control commands of the memory management circuit 702 are implemented in a form of a firmware. For instance, the memory management circuit 702 has a microprocessor unit (not illustrated) and a ROM (not illustrated), and the control commands are burned into the ROM. If the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 702 if the memory control circuit unit 404 is enabled. Thereafter, the control commands are executed by the microprocessor unit to execute operations of writing, reading or erasing data.

Further, in another exemplary embodiment, the control commands of the memory management circuit 702 may also be implemented in a form of hardware. For example, the memory management circuit 702 includes a microprocessor, a physical unit management circuit, a memory writing circuit, a memory reading circuit, a memory erasing circuit and a data processing circuit. The physical unit management circuit, the memory writing circuit, the memory reading circuit, the memory erasing circuit and the data processing circuit are coupled to the microprocessor. The physical unit management circuit is configured to manage physical erasing units of the rewritable non-volatile memory module 406; the memory writing circuit is configured to issue a write command sequence for the rewritable non-volatile memory module 406 in order to write data into the rewritable non-volatile memory module 406; the memory reading circuit is configured to issue a read command sequence for the rewritable non-volatile memory module 406 in order to read data from the rewritable non-volatile memory module 406; the memory erasing circuit is configured to issue an erase command sequence for the rewritable non-volatile memory module 406 in order to erase data from the rewritable non-volatile memory module 406; the data processing circuit is configured to process both the data to be written into the rewritable non-volatile memory module 406 and the data to be read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing.

The host interface 704 is coupled to the memory management circuit 702 and configured to receive and identify commands and data sent from the host system 11. In other words, the commands and data sent from the host system 11 are passed to the memory management circuit 702 through the host interface 704. In the present exemplary embodiment, the host interface 704 is compatible with the SATA standard. However, it should be understood that the present invention is not limited thereto, and the host interface 704 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable to the rewritable non-volatile memory module 406 through the memory interface 706. Specifically, if the memory management circuit 702 intends to access the rewritable non-volatile memory module 406, the memory interface 706 sends corresponding command sequences. The command sequences may include one or more signals, or data from the bus. For example, in a read command sequence, information such as identification codes and memory addresses are included.

The error checking and correcting circuit 708 is coupled to the memory management circuit 702 and configured to execute an error checking and correcting process to ensure the correctness of data. Specifically, if the memory management circuit 702 receives the write command from the host system 11, the error checking and correcting circuit 708 generates an error correcting code (ECC) and/or an error detecting code (EDC) for data corresponding to the write command, and the memory management circuit 702 writes data and the ECC and/or the EDC corresponding to the write command to the rewritable non-volatile memory module 406. Subsequently, if the memory management circuit 702 reads the data from the rewritable non-volatile memory module 406, the corresponding ECC and/or the EDC are also read, and the error checking and correcting circuit 708 executes the error checking and correcting procedure on the read data based on the ECC and/or the EDC.

In an exemplary embodiment, the memory control circuit unit 404 further includes a buffer memory 710 and a power management circuit 712. The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

Figure 8:
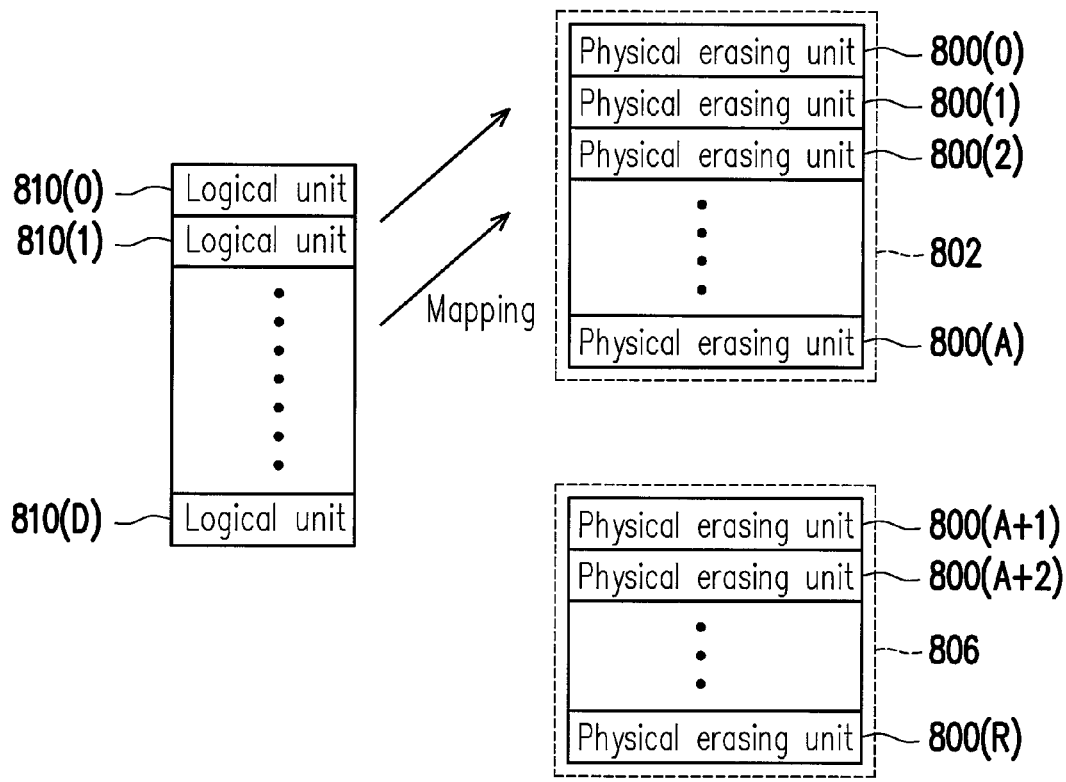
FIG. 8 is a schematic diagram illustrating management of a rewritable non-volatile memory module according to an exemplary embodiment of the invention.

FIG. 8 is a schematic diagram illustrating management of a rewritable non-volatile memory module according to an exemplary embodiment of the invention. It should be understood that terms, such as "select," "group," "divide," "associate" and so forth, are logical concepts which describe operations in the physical erasing units of the rewritable non-volatile memory module 406. That is, the physical erasing units of the rewritable non-volatile memory module are logically operated, but actual positions of the physical erasing units of the rewritable non-volatile memory module are not changed.

The memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than two bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is faster than a writing speed of the upper physical programming unit, and/or a reliability of the lower physical programming unit is higher than a reliability of the upper physical programming unit. In the present exemplary embodiment, the physical programming unit is a minimum unit for programming. That is, the programming unit is the minimum unit for writing data. For example, the physical programming unit is a physical page or a physical sector. If the physical programming unit is the physical page, the physical programming unit may include a data bit area and a redundancy bit area. The data bit area has multiple physical sectors configured to store user data, and the redundant bit area is configured to store system data (e.g., an error correcting code). In the present exemplary embodiment, the data bit area contains 32 physical sectors, and a size of each physical sector is 512-byte (B). However, in other exemplary embodiments, the data bit area may also include 8, 16, or more or less of the physical sectors, and the size of each physical sector is not limited in the invention. On the other hand, the physical erasing unit is the minimal unit for erasing. Namely, each physical erasing unit contains the least number of memory cells to be erased together. For instance, the physical erasing unit is a physical block.

Referring to FIG. 8, the memory management circuit 702 may logically divide the physical erasing units 800(0) to 800(R) of the rewritable non-volatile memory module 406 into a plurality of areas such as a storage area 802 and a system area 806.

The physical erasing units in the storage area 802 are configured to store data from the host system 11. The storage area 802 stores valid data and invalid data. For example, if the host system intends to delete one valid data, the data being deleted may still be stored in the storage area 802 but marked as the invalid data. The physical erasing unit not storing the valid data is also known as a spare physical erasing unit. For example, the physical erasing unit being erased may become the spare physical erasing unit. If there are damaged physical erasing units in the storage area 802 or the system area 806, the physical erasing units in the storage area 802 may also be used to replace the damaged physical erasing units. If there are no available physical erase units in the storage area 802 for replacing the damaged physical erasing units, the memory management circuit 702 may announce that the memory storage device 10 is in a write protect status, so that data can no longer be written thereto. In addition, the physical erasing unit storing the valid data is also known as a non-spare physical erasing unit.

The physical erasing units in the system area 806 are configured to record system information including information related to manufacturer and model of a memory chip, a number of physical erasing units in the memory chip, a number of the physical programming unit in each physical erasing unit, and so forth.

Amounts of the physical erasing units in the storage area 802 and the system area 806 may be different based on the different memory specifications. In addition, it should be understood that, during operations of the memory storage device 10, grouping relations of the physical erasing units associated to the storage area 802 and the system area 806 may be dynamically changed. For example, if damaged physical erasing units in the system area 806 are replaced by the physical erasing units in the storage area 802, the physical erasing units originally from the storage area 802 are then associated to the system area 806.

The memory management circuit 702 configures the logical units 810(0) to 810(D) for mapping to the physical erasing units 800(0) to 800(A) in the storage area 802. For example, in the present exemplary embodiment, the host system 11 accesses the data stored in the storage area 802 through logical addresses. Therefore, each of the logical units 810(0) to 810(D) refers to one logical address. However, in another exemplary embodiment, each of the logical units 810(0) to 810(D) may also refer to one logical sector, one logical programming unit, one logical erasing unit, or a composition of a plurality of consecutive logical addresses. Each of the logical units 810(0) to 810(D) maps to one or more physical units. In the present exemplary embodiment, one physical unit refers to one physical erasing unit. However, in another exemplary embodiment, one physical unit may also be one physical address, one physical sector, one physical programming unit, or a composition of a plurality of consecutive physical addresses, which are not particularly limited in the invention. The memory management circuit 702 records mapping relations between the logical units and the physical units into one or more logical-to-physical mapping tables. If the host system 11 intends to read the data from the memory storage device 10 or write the data into the memory storage device 10, the memory management circuit 702 may access the data in the memory storage device 10 according to said logical-to-physical mapping tables.

Figure 9:
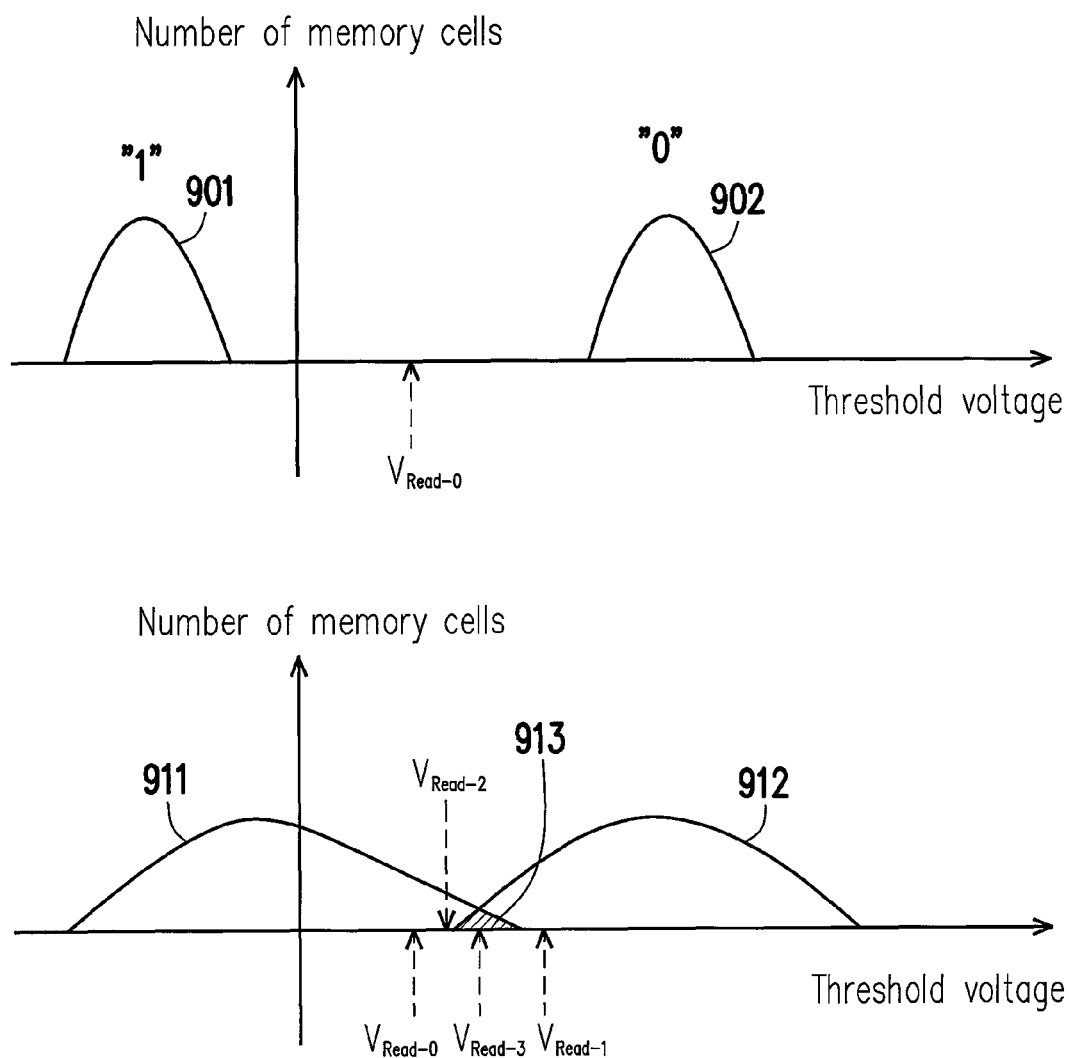
FIG. 9 is a schematic diagram illustrating distributions of threshold voltages of a plurality of memory cells according to an exemplary embodiment of the invention.

FIG. 9 is a schematic diagram illustrating distributions of threshold voltages of a plurality of memory cells according to an exemplary embodiment of the invention.

Referring to FIG. 9, a horizontal axis represents the threshold voltage of the memory, and a vertical axis represents a number of the memory cells. For instance, FIG. 9 illustrates the threshold voltage of each memory cell in one specific physical unit. It is assumed that, if the threshold voltage of a specific memory cell falls in a distribution 901, the bit stored in the memory cell is the bit "1," otherwise, if the threshold voltage of the specific memory cell falls in a distribution 902, the bit stored in the memory cell is the bit "0." It is worth mentioning that, in the present exemplary embodiment, each of the memory cells is configured to store one bit, and thus there are two possible distributions of the threshold voltages. However, in other exemplary embodiments, if one memory cell is configured to store a plurality of bits, there can be four, eight, or any other number of possible distributions of the corresponding threshold voltages. In addition, the bit represented by each distribution is not particularly limited in the invention.

If it is intended to read the data from the rewritable non-volatile memory module 406, the memory management circuit 702 transmits a read command sequence to the rewritable non-volatile memory module 406. The read command sequence includes one or more commands or program codes. The read command sequence is configured to instruct reading a plurality of memory cells in one specific physical unit to obtain a plurality of bits. For example, according to the read command sequence, the rewritable non-volatile memory module 406 may use a read voltage $V_{read-0}$ to read the memory cells and transmit the corresponding bit data to the memory management circuit 702. For example, if the threshold voltage of one specific memory cell is small than the read voltage $V_{read-0}$ (e.g., the memory cell belonging the distribution 901), the bit "1" is read by the memory management circuit 702; and if the threshold voltage of one specific memory cell is greater than the read voltage $V_{read-0}$ (e.g., the memory cell belonging the distribution 902), the bit "0" is read by the memory management circuit 702.

However, with increases in the usage time and/or changes in an operation environment of the rewritable non-volatile memory module 406, a performance degradation may occur on the distributions 901 and 902. If the performance degradation occurs, the distributions 901 and 902 may gradually move close to each other or to even overlap with each other. For example, a distribution 911 and a distribution 912 are used to represent the distributions 901 and 902 after occurrence of the performance degradation, respectively. The distribution 911 and the distribution 912 include an overlap region 913. The overlap region 913 indicates that, some of the memory cells are supposed to store the bit "1" yet having the threshold voltages greater than the read voltage $V_{read-0}$; or, some of the memory cells are supposed to store the bit "0" yet having the threshold voltages small than the read voltage $V_{read-0}$. After occurrence of the performance degradation, if the read voltage $V_{read-0}$ is continually used to read the memory cells belonging to the distribution 911 or the distribution 912, the bits being read may include more errors. For example, the memory cells belonging to the distribution 911 may be mistakenly determined as belonging to the distribution 912, or the memory cells belonging to the distribution 912 may be mistakenly determined as belonging to the distribution 911. Therefore, in the present exemplary embodiment, the error checking and correcting circuit 708 performs decoding on the read bits so as to correct the errors therein. In the following exemplary embodiments, the read voltage is also known as a read voltage level. Each read voltage level includes at least one voltage value.

In the present exemplary embodiment, the error checking and correcting circuit 708 encodes the data to be stored into the rewritable non-volatile memory module 406 and generates one encoding unit. The encoding unit belongs to a block code. The memory management circuit 702 sends one write command sequence to the rewritable non-volatile memory module 406. The write command sequence includes at least one command or program code. The write command sequence is configured to instruct writing the encoding unit into one suitable region (hereinafter, also known as the first region) in the rewritable non-volatile memory module 406. For example, the first region may be at least one physical unit. According to the write command sequence, the rewritable non-volatile memory module 406 stores the encoding unit into the first region. Later, if the memory management circuit 702 instructs to read the data in the first region, the rewritable non-volatile memory module 406 reads the encoding unit from the first region, and the error checking and correcting circuit 708 performs a decoding procedure to decode the encoding unit.

Figure 10:
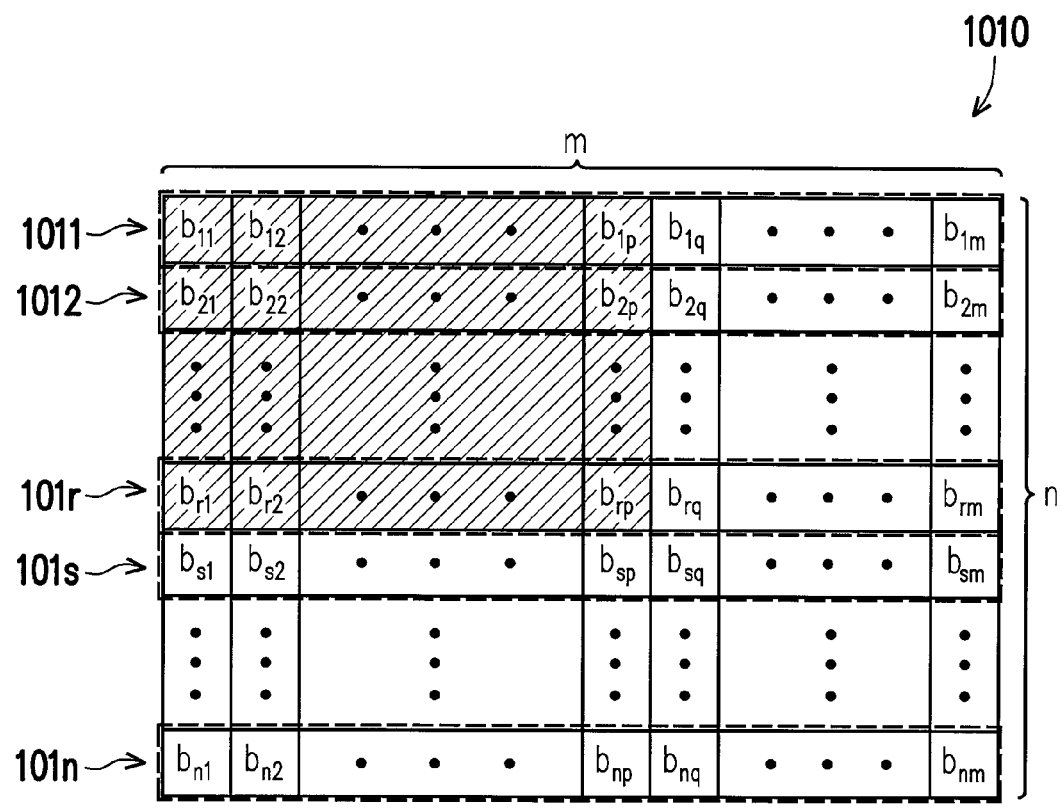
FIG. 10 is a schematic diagram illustrating an encoding unit according to an exemplary embodiment of the invention.

FIG. 10 is a schematic diagram illustrating an encoding unit according to an exemplary embodiment of the invention.

Referring to FIG. 10, an encoding unit 1010 includes bits $b_{11}$ to $b_{nm}$. If the bits $b_{11}$ to $b_{nm}$ are grouped into sub encoding units 1011 to 101$n$, each of the sub encoding units 1011 to 101$n$ includes an m number of bits. Noted that, n and m may be any positive integer greater than 1, respectively. In the present exemplary embodiment, parts of the bits are determined by a plurality of encoding procedures. For example, the encoding procedure based on an encoding direction of a row direction (e.g., from the left to the right) may be regarded as a first-type encoding procedure, and the encoding procedure based on another encoding direction of a column direction (e.g., from the top to the bottom) may be regarded as a second-type encoding procedure. In the exemplary embodiment, the first-type encoding procedure is also known as a row encoding procedure, and the second-type encoding procedure is also known as a column encoding procedure.

In the present exemplary embodiment, the first-type encoding procedure is first performed, and the second-type encoding procedure is performed subsequently according to an encoding result of the first-type encoding procedure. For example, assuming that the user data to be stored includes the bits $b_{11}$ to $b_{1p}$, $b_{21}$ to $b_{2p}$, ..., $b_{r1}$ to $b_{rp}$, in the first-type encoding procedure, the bits $b_{11}$ to $b_{1p}$, $b_{21}$ to $b_{2p}$, ..., $b_{r1}$ to $b_{rp}$ are respectively encoded to obtain the bits $b_{11}$ to $b_{1m}$ (i.e., the sub encoding unit 1011), $b_{21}$ to $b_{2m}$ (i.e., the sub encoding unit 1012), ..., $b_{r1}$ to $b_{rm}$ (i.e., the sub encoding unit 101$r$). The bits $b_{1q}$ to $b_{1m}$ are the error correcting codes corresponding to the bits $b_{11}$ to $b_{1p}$, and the bits $b_{2q}$ to $b_{2m}$ are the error correcting codes corresponding to the bits $b_{21}$ to $b_{2p}$, and the rest may be deduced by analogy, wherein q is equal to p+1. After the sub encoding units 1011 to 101$r$ are obtained, the second-type encoding procedure is performed. For example, in the second-type encoding procedure, the bits $b_{11}$ to $b_{r1}$ (i.e., first bits of the sub encoding units 1011 to 101$r$), the bits $b_{l2}$ to $b_{r2}$ (i.e., second bits of the sub encoding units 1011 to 101$r$), ..., the bits $b_{1m}$ to $b_{rm}$ (i.e., $m^{th}$ bits of the sub encoding units 1011 to 101$r$) are respectively encoded to obtain the bits $b_{11}$ to $b_{n1}$, $b_{l2}$ to $b_{n2}$, ..., $b_{1m}$ to $b_{nm}$. The bits $b_{s1}$ to $b_{n1}$ are the error correcting codes corresponding to the bits $b_{11}$ to $b_{r1}$, and the bits $b_{s2}$ to $b_{n2}$ are the error correcting codes corresponding to the bits $b_{l2}$ to $b_{r2}$, and the rest may be deduced by analogy, wherein s is equal to r+1.

After the encoding unit 1010 is read, the encoding unit 1010 is decoded in correspondence with an adopted encoding sequence. For example, in the present exemplary embodiment, a decoding procedure based on a decoding direction of the column direction (also known as a second-type decoding procedure) is first performed, and another decoding procedure based on a decoding direction of the row direction (also known as a first-type decoding procedure) is performed subsequently according to a decoding result of the second-type decoding procedure. For example, in the second-type decoding procedure, the bits $b_{s1}$ to $b_{n1}$, $b_{s2}$ to $b_{n2}$, ..., $b_{sm}$ to $b_{nm}$ are respectively used to decode the bits $b_{11}$ to $b_{r1}$, $b_{l2}$ to $b_{r2}$, ..., $b_{1m}$ to $b_{rm}$. After the decoded bits $b_{11}$ to $b_{r1}$, $b_{l2}$ to $b_{r2}$, ..., $b_{1m}$ to $b_{rm}$ are obtained, the first-type decoding procedure is performed. For example, in the first-type decoding procedure, the bits $b_{1q}$ to $b_{1m}$, $b_{2q}$ to $b_{2m}$, ..., $b_{rq}$ to $b_{rm}$ decoded by the second-type decoding procedure are respectively used to decode the bits $b_{11}$ to $b_{1p}$, $b_{21}$ to $b_{2p}$, ..., $b_{r1}$ to $b_{rp}$, also decoded by the second-type decoding procedure, to obtain the decoded user data.

It is worth mentioning that, the composition of the encoding units and the encoding/decoding sequence as mentioned in the foregoing exemplary embodiments are merely an example rather than limitations to the invention. For example, in another exemplary embodiment, the generated error correcting codes may also be arranged in front of the corresponding user data or inserted in the corresponding user data. Alternatively, in an exemplary embodiment, if the user data is to be encoded, it is also possible that the second-type encoding procedure is first performed, and then the first-type encoding procedure is performed according to an encoding result of the second-type encoding result; and correspondingly, if the encoding unit is to be decoded, the first-type decoding procedure may be first performed, and then the second-type decoding procedure may be performed according to a decoding result of the first-type encoding result. In addition, the first-type encoding procedure (or the first-type decoding procedure) and the second-type encoding procedure (or the second-type decoding procedure) are different in terms of the encoding (or decoding) direction, but the first-type encoding procedure (or the first-type decoding procedure) and the second-type encoding procedure (or the second-type decoding procedure) may adopt the same or different encoding/decoding algorithms. For example, the first-type encoding procedure and the corresponding first-type decoding procedure may include at least one of various encoding/decoding algorithms such as a low density parity code (LDPC), a BCH code, a Reed-Solomon code (RS code) and a block turbo code (BTC); whereas the second-type encoding procedure and the corresponding second-type decoding procedure may also include at least one the aforementioned encoding/decoding algorithms or other encoding/decoding algorithms.

In the present exemplary embodiment, the memory management circuit 702 sends a read command sequence (hereinafter, also known as a first read command sequence) to the rewritable non-volatile memory module 406. The first read command sequence is configured to instruct reading the data from the first region. After the first read command sequence is received, the rewritable non-volatile memory module 406 reads a plurality of memory cells in the first region according to a read voltage level (hereinafter, also known as a first read voltage level) to obtain an encoding unit (hereinafter, also known as a first encoding unit). The first encoding unit belongs to the block code. Description regarding the encoding unit has been introduced in detail as above, which is not repeated hereinafter. Thereafter, the error checking and correcting circuit 708 performs a decoding procedure (hereinafter, also known as a first decoding procedure) on the first encoding unit and records corresponding decoding information (hereinafter, also known as first decoding information).

In the present exemplary embodiment, the first decoding procedure belongs to an iteration decoding procedure. For example, in the first decoding procedure, the error checking and correcting circuit 708 performs at least one iteration decoding calculation, so as to iteratively update realizability information (e.g., a decoding initial value) of the first encoding unit to improve a decoding success rate of the first encoding unit. Each iteration decoding calculation may include a decoding operation identical or similar to that introduced in the exemplary embodiment of FIG. 10. In general, depending on a number of errors (also known as error bits) in the encoding unit, the first decoding procedure may success or fail. For example, after the at least one iteration decoding calculation is performed, if the decoding success (e.g., the error checking and correcting circuit 708 determines that all the errors in the first encoding unit are corrected), the error checking and correcting circuit 708 outputs the decoded (or corrected) first encoding unit. Otherwise, if a number of times for performing the iteration decoding calculation by the error checking and correcting circuit 708 reaches a preset number of times due to factors such as the number of the error bits in the first encoding unit being too many or the distributions of the error bits locating at positions where the errors cannot be corrected, the error checking and correcting circuit 708 determines that the decoding fails.

It is worth mentioning that, in view of the exemplary embodiment of FIG. 10, it can be known that the first-type decoding procedure corresponding to one specific row or the second-type decoding procedure corresponding to one specific column may either success or fail. The first-type decoding procedure performed each time is independent to each other, and the second-type decoding procedure performed each time is also independent to each other. For example, the first-type decoding procedure for the sub encoding unit 1011 may success or fail, the first-type decoding procedure for the sub encoding unit 1012 may success or fail, and these two results may not be related. Even if the decoding for the first encoding unit fails, the first encoding unit may still include the rows, the columns or the bits which are successfully decoded.

The memory management circuit 702 records those successfully decoded information as the first decoding information. For example, the first decoding information includes a value (hereinafter, also known as a first value). The first value is related to a decoding result (hereinafter, also known as a first decoding result) of the first encoding unit. For example, the first value is determined according to the first decoding result. For example, the first value is positively correlated to a decoding success unit count (hereinafter, also known as a first decoding success unit count) of the first decoding procedure. In the present exemplary embodiment, the first decoding success unit count refers to a number of units successfully decoded in the first encoding unit. For example, one successfully decoded unit may refer to one successfully decoded row, one successfully decoded column or one successfully decoded bit. The memory management circuit 702 may directly use the first decoding success unit count as the first value. For example, the memory management circuit 702 may directly use a number (hereinafter, also known as a first row decoding success unit count) of the successfully decoded rows in the first encoding unit, a number (hereinafter, also known as a first column decoding success unit count) of the successfully decoded columns in the first encoding unit or a number of the successfully decoded bits in the first encoding unit as the first value. Alternatively, the memory management circuit 702 may determine the first value by performing a logical operation according to the first row decoding success unit count and the first column decoding success unit count. For example, the memory management circuit 702 may multiply the first row decoding success unit count by a weight (hereinafter, also known as a first weight) to obtain a parameter (hereinafter, a first parameter) and multiply the first column decoding success unit count by another weight (hereinafter, also known as a second weight) to obtain another parameter (hereinafter, also known as a second parameter); and the memory management circuit 702 may determine the first value by adding the first parameter and the second parameter together. Take the exemplary embodiment of FIG. 10 as an example, the first weight may be n/(n+m), and the second weight may be m/(n+m). However, the first weight and the second weight may also be set respectively according to practical requirement, which are not particularly limited in the invention. Further, in another exemplary embodiment, the memory management circuit 702 may also input the first decoding success unit count into a look-up table and use an output of the look-table as the first value.

After determining that the decoding for the first encoding unit fails, the memory management circuit 702 instructs the rewritable non-volatile memory module 406 to adjust the read voltage. For example, the read voltage for reading the first region is adjusted from the first read voltage level to another read voltage level (hereinafter, also known as a second read voltage level). The memory management circuit 702 sends another read command sequence (hereinafter, also known as a second read command sequence) to the rewritable non-volatile memory module 406. The second read command sequence is configured to instruct reading the first region according to the second read voltage level. After receiving the second read command sequence, the rewritable non-volatile memory module 406 reads the memory cells in the first region again according to the second read voltage level to obtain another encoding unit (hereinafter, also known as a second encoding unit). The second encoding unit also belongs to the block code. Because the read voltage level for reading data is changed, parts of bits in the second encoding unit may be different from the bits in the first encoding unit at the same positions. For example, the bit $b_{11}$ in the second encoding unit may be different from the bit $b_{11}$ in the first encoding unit.

The error checking and correcting circuit 708 performs another decoding procedure (hereinafter, also known as a second decoding procedure) on the second encoding unit and records corresponding decoding information (hereinafter, also known as second decoding information). Description regarding how to perform the decoding procedure on the encoding unit has been provided in detail above, which is not repeated hereinafter.

It is worth mentioning that, even if the decoding for the second encoding unit fails, the second encoding unit may still include the rows, the columns or the bits which are successfully decoded. The memory management circuit 702 records those successfully decoded information as the second decoding information. For example, the second decoding information includes a value (hereinafter, also known as a second value). The second value is related to a decoding result (hereinafter, also known as a second decoding result) of the second encoding unit. For example, the second value is determined according to the second decoding result. For example, the second value is positively correlated to a decoding success unit count (hereinafter, also known as a second decoding success unit count) of the second decoding procedure. In the present exemplary embodiment, the second decoding success unit count refers to a number of units successfully decoded in the second encoding unit. For example, the memory management circuit 702 may directly use a number (hereinafter, also known as a second row decoding success unit count) of successfully decoded rows in the second encoding unit, a number (hereinafter, also known as a second column decoding success unit count) of successfully decoded columns in the second encoding unit or a number of successfully decoded bits in the second encoding unit as the second value. Alternatively, the memory management circuit 702 may determine the second value by performing a logical operation according to the second row decoding success unit count and the second column decoding success unit count. Further, the memory management circuit 702 may also input the second decoding success unit count into a look-up table and use an output of the look-table as the second value. Description regarding how to determine the second value may refer to the description related to the first value, which is not repeated hereinafter.

After obtaining the first decoding information and the second decoding information, the memory management circuit 702 estimates another read voltage level (hereinafter, also known as a third read voltage level) according to the first decoding information and the second decoding information. In the present exemplary embodiment, the third read voltage level may be regarded as an optimized read voltage level estimated for the first region. For example, the optimized read voltage level may refer to a read voltage level which is estimated according to history records from the past, and capable of reading the encoding unit with the highest success rate of decoding. For example, the memory management circuit 702 may compare the first value and the second value and determine the third read voltage level according to a comparison result. For example, if the first value is greater than the second value, the memory management circuit 702 may determine the third read voltage level according to the first read voltage level. For example, in the present exemplary embodiment, if the first value is greater than the second value, the memory management circuit 702 may directly set the first read voltage level to be the third read voltage level. Alternatively, in another exemplary embodiment, if the first value is greater than the second value, the memory management circuit 702 may also perform a logical operation according to the first read voltage level to determine the third read voltage level, which is not particularly limited in the invention. Otherwise, if the first value is less than the second value, the memory management circuit 702 may determine the third read voltage level according to the second read voltage level. For example, in the present exemplary embodiment, if the first value is less than the second value, the memory management circuit 702 may directly set the second read voltage level to be the third read voltage level. Alternatively, in another exemplary embodiment, if the first value is less than the second value, the memory management circuit 702 may also perform a logical operation according to the second read voltage level to determine the third read voltage level, which is not particularly limited in the invention.

It is worth mentioning that, although two consecutive reading operations and decoding operations are performed as an example in the foregoing exemplary embodiments, however, in another exemplary embodiment, it also possible that the two reading operations and decoding operations mentioned in the foregoing exemplary embodiments are not consecutive. More of the reading operations and decoding operations may be used to process the data stored in the same region. For example, in an exemplary embodiment of FIG. 9, a plurality of available read voltage levels $V_{read-0}$ to $V_{read-3}$ may be recorded in one look-up table. According to said look-up table, the read voltage level $V_{read-0}$ may first be used to read the data in the first region. Later, if the decoding for the read encoding unit fails, according to said look-up table, the read voltage level $V_{read-1}$ may then be used subsequently to read the data in the first region. Later, if the decoding for the read encoding unit still fails, the read voltage level $V_{read-2}$ may be used subsequently to read the data in the first region and the corresponding decoding operation is performed. Later, if the decoding for the read encoding unit still fails, the read voltage level $V_{read-3}$ may be used subsequently to read the data in the first region and the corresponding decoding operation is performed. The first read voltage level as mentioned in the foregoing exemplary embodiments may be any one of the read voltage levels $V_{read-0}$ to $V_{read-2}$ depicted in FIG. 9, and the second read voltage level as mentioned in the foregoing exemplary embodiments may be any one of the read voltage levels applied after the first read voltage level. For example, if the first read voltage level is the read voltage level $V_{read-0}$, the second read voltage level may be any one of the read voltage levels $V_{read-1}$ to $V_{read-3}$, and the rest may be deduced by analogy. In addition, a sequence for the read voltage levels $V_{read-0}$ to $V_{read-3}$ to be used may also be adjusted, which is particularly limited in the invention. For example, in another exemplary embodiment, the read voltage levels $V_{read-0}$ to $V_{read-3}$ may also be sequential used according their voltage values in an ascending manner or similar manners.

In an exemplary embodiment, for the same region in the rewritable non-volatile memory module 406, aforesaid operation of determining the third read voltage level according to the used read voltage levels is performed only if all the read voltage levels recorded in the look-up table have been used and yet all the read encoding units can still not be successfully decoded. However, in another exemplary embodiment, it can also be set that, the operation of determining the third read voltage level according to the used read voltage levels may be performed once a number of times for using different read voltage levels or a number of times for changing the used read voltage level exceeds a preset number of times, which is not particularly limited in the invention. Further, although the first decoding procedure and the second decoding procedure are the iteration decoding procedure in the foregoing exemplary embodiments, in another exemplary embodiment, the first decoding procedure and/or the second decoding procedure may also belong to a non-iteration decoding procedure, which are not particularly limited in the invention.

In an exemplary embodiment, in the process of using one specific read voltage level to read the encoding unit and performing the corresponding decoding procedure, a part of bit values on the successfully decoded positions may be regarded as correct and be recorded. For example, if one specific row or column is successfully decoded, the bit value on each position in the specific row or column may be recorded. In the next decoding procedure, the recorded bit values may serve as additional decoding information. For example, in an exemplary embodiment, assuming that the decoding for one specific encoding unit fails but the decoding result thereof indicates that the bit $b_{11}$ is correct, therefore the bit value of the bit $b_{11}$ is recorded. After adjusting the read voltage level for reading the same data, in the next decoding performed on the read data, the bit $b_{11}$ in the read encoding unit may be directly corrected to contain the previously recorded bit value. Alternatively, in the next decoding procedure, the recorded bit value may be skipped, so as to reduce a number of bits to be checked in the encoding unit obtained each time. Accordingly, in the process of performing the corresponding decoding procedures according to the different read voltage levels, parts of the bits in each encoding unit may be gradually corrected to increase the decoding success rate. Further, the invention is not intended to limit a type of the additional decoding information to be passed along, and any decoding information that can be passed to the next decoding procedure may be recorded and adopted in the next decoding procedure.

After the third read voltage level is determined, the memory management circuit 702 may performed at least one preset operation related to the rewritable non-volatile memory module 406 according to the third read voltage level. The preset operation may be used to optimize the rewritable non-volatile memory module 406 in terms of storing data, reading data or managing the physical units.

In an exemplary embodiment, the error checking and correcting circuit 708 may perform a hard bit mode decoding and a soft bit mode decoding. Take the SLC flash memory as an example, in the hard bit mode decoding, one read voltage level is applied to one memory cell. According to whether the memory cell is turned on in response to said read voltage level, the rewritable non-volatile memory module 406 transmits one bit (also known as a verification bit) in return. Later, the error checking and correcting circuit 708 performs the decoding according to the verification bit. In the hard bit mode decoding, the obtained verification bit is also known as a hard bit. In the same example of the SLC flash memory, in the soft bit mode decoding, multiple read voltage levels are applied to one memory cell. According to whether the memory cell is turned on in response to said read voltage levels, the rewritable non-volatile memory module 406 transmits a plurality of verification bits in return. Later, the error checking and correcting circuit 708 performs the decoding according to the verification bits. In the soft bit mode decoding, the obtained verification bits are also known as soft bits. In the iteration decoding procedure of the hard bit mode decoding, the decoding initial value of one memory cell may include two values according to one verification bit corresponding to the memory cell. For example, if the verification bit is "1," the decoding initial value of the corresponding memory cell may be set to "−n," and if the verification bit is "0," the decoding initial value of the corresponding memory cell may be set to "+n." The iteration decoding procedure of the hard bit mode decoding is performed based on said two decoding initial values. However, in the iteration decoding procedure of the soft bit mode decoding, a decoding initial value of one memory cell is determined according to multiple verification bits corresponding to the memory cell.

In an exemplary embodiment, before all the read voltage levels in the look-up table are used, the decodings performed by the error checking and correcting circuit 708 all belong to the hard bit mode decoding. If the data read from the same region can still not be successfully decoded and all the read voltage levels in the look-up table are used, the error checking and correcting circuit 708 may switch to use the soft bit mode decoding. In the soft bit mode decoding, the memory management circuit 702 instructs to read the first region according to the third read voltage level to obtain an encoding unit (hereinafter, also known as a third encoding unit). Further, the memory management circuit 702 also instruct to determine a plurality of read voltage levels (hereinafter, also known as fourth read voltage levels) having voltage values located nearby the voltage value of the third read voltage level according to the third read voltage level, and the memory management circuit 702 instruct to read the first region according to the fourth read voltage levels, so as to obtain a plurality of soft bits. The fourth read voltage levels may include or not include the third read voltage level. Each of the soft bits may provide the additional decoding information of one bit in the third encoding unit. The error checking and correcting circuit 708 may perform a corresponding decoding procedure (also known as a third decoding procedure) on the third encoding unit.

Figure 11:
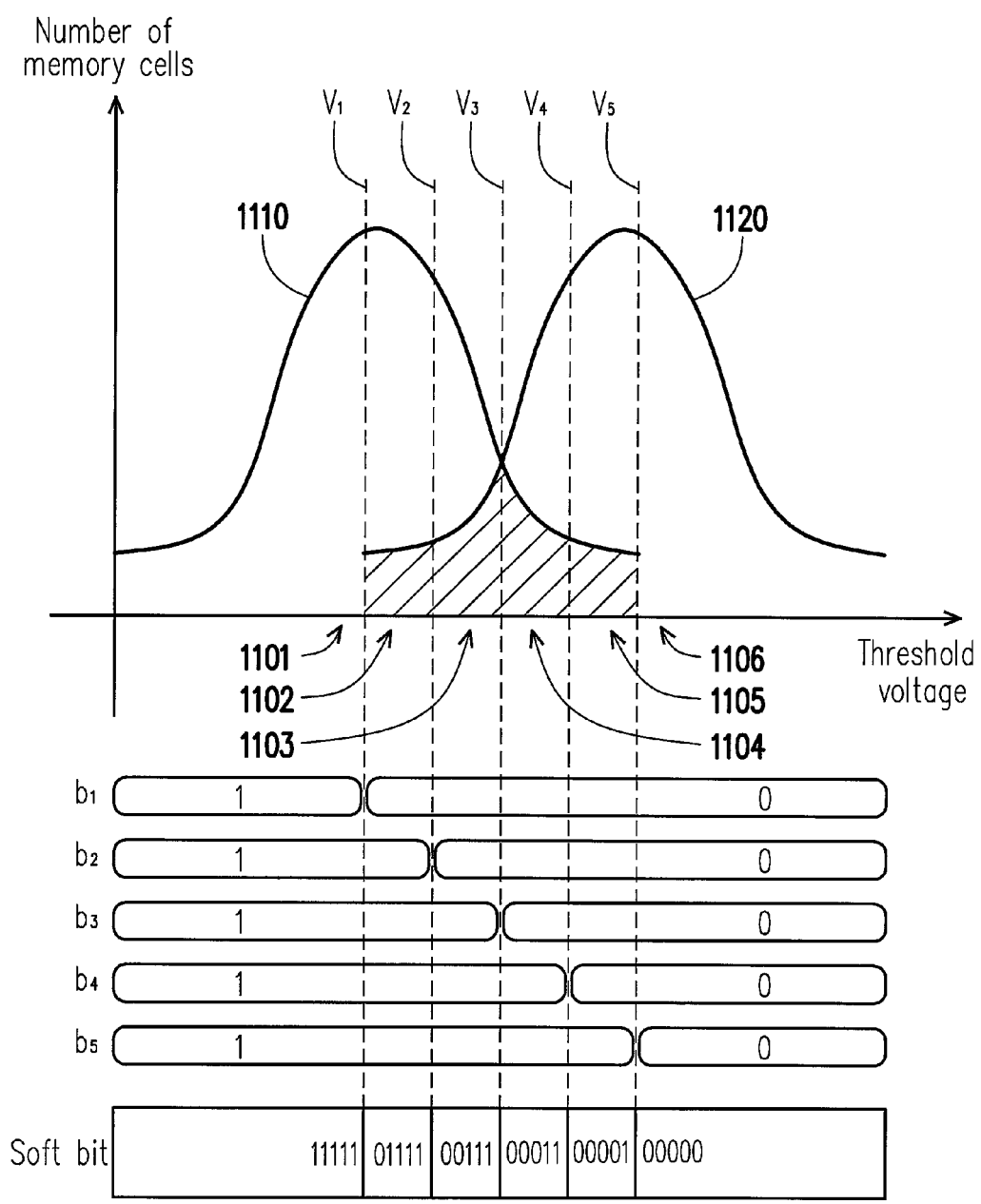
FIG. 11 is a schematic diagram of reading a plurality of soft bits according to an exemplary embodiment of the invention.

FIG. 11 is a schematic diagram of reading a plurality of soft bits according to an exemplary embodiment of the invention.

Referring to FIG. 11, assuming that the determined fourth read voltage levels include read voltage levels $V_1$ to $V_5$, in the soft bit mode decoding, the read voltage levels $V_1$ to $V_5$ are used to read the memory cells belonging to the distributions 1110 and 1120 in the first region. In response to the read voltage levels $V_1$ to $V_5$, multiple soft bits $b_1$ to $b_5$ are obtained. For example, if the threshold voltage of one specific memory cell is located within a voltage interval 1101, the read soft bits $b_1$ to $b_5$ are "11111," if the threshold voltage of one specific memory cell is located within a voltage interval 1102, the read soft bits $b_1$ to $b_5$ are "01111"; if the threshold voltage of one specific memory cell is located within a voltage interval 1103, the read soft bits $b_1$ to $b_5$ are "00111," if the threshold voltage of one specific memory cell is located within a voltage interval 1104, the read soft bits $b_1$ to $b_5$ are "00011"; if the threshold voltage of one specific memory cell is located within a voltage interval 1105, the read soft bits $b_1$ to $b_5$ are "00001"; and if the threshold voltage of one specific memory cell is located within a voltage interval 1106, the read soft bits $b_1$ to $b_5$ are "00000." In the soft bit mode decoding, the read soft bits $b_1$ to $b_5$ are used to perform the corresponding iteration decoding on the third encoding unit. For example, in correspondence with each of the voltage intervals, a probability that the memory cells belong to the distribution 1110 and a probability that the memory cells belong to the distribution 1120 may be calculated in advance. A log likelihood ratio (LLR) value may be calculated according to said two probabilities. The LLR value may be used to determine an absolute value of a decoding initial value. For example, the LLR value corresponding to each of the voltage ranges may be calculated and stored in one look-up table in advance. The obtained soft bits $b_1$ to $b_5$ may be inputted into the look-up table, and the corresponding decoding initial value may then be obtained. Later, the error checking and correcting circuit 708 may perform the subsequent decodings according to the obtained decoding initial value.

In other words, as compared to the hard bit mode decoding, amount of the decoding information (e.g., the verification bits) used by the soft bit mode decoding is relatively more. Based on more of the used decoding information, the decoding success rate of the soft bit mode decoding is usually higher than the decoding success rate of the hard bit mode decoding. Therefore, the soft bit mode decoding is capable of completing the decoding under the circumstance where the hard bit mode decoding fails.

In an exemplary embodiment, the memory management circuit 702 may determine a wear degree of a plurality of memory cells in the first region or a voltage distribution status of the memory cells according to the third read voltage level. For example, in the exemplary embodiment of FIG. 9, for the memory cells belonging to the distributions 901 and 902, the data with lower error rate may be read by using the read voltage level $V_{read-0}$ to read the memory cells; and after the performance degradation occurs, for the memory cells belonging to the distributions 911 and 912, the data with lower error rate may be read by using the read voltage level $V_{read-3}$ to read the memory cells. Therefore, according to the determined third read voltage level, the memory management circuit 702 is also capable of obtaining the current wear degree of the memory cells or the current voltage distribution status of the memory cells by methods such as utilizing the look-up table. For example, each of the read voltage levels $V_{read-0}$ to $V_{read-3}$ may correspond to one wear degree or one voltage distribution status. It is worth mentioning that, in an exemplary embodiment, the wear degree is related to a usage status of the memory cells or a current operation environment of the memory cells. For example, if a reading count of the memory cells, a writing count of the memory cells and/or an erasing count of the memory cells are increased, the wear degree of the memory cells may also be increased synchronously. For example, if a time interval for storing the data in the memory cells is increased, the wear degree of the memory cells may also be increased synchronously. For example, if a temperature or a humidity of the current operation environment is overly high, the wear degree of the memory cells may also be increased synchronously. In addition, the wear degree of specific memory cells may also be related to the correctness/the error rate of the data stored in the memory cells. For example, if the wear degree of the memory cells is higher, the correctness of the data stored in the memory cells is lower and/or the error rate of the data stored in the memory cells is higher.

In an exemplary embodiment, the memory management circuit 702 may determine a preset programming voltage corresponding to the first region according to the third read voltage level. For example, if the rewritable non-volatile memory module 406 uses an incremental step pulse program (ISPP) model to program the memory cells, the memory management circuit 702 may instruct the rewritable non-volatile memory module 406 to adjust an initial programming voltage in the incremental step pulse program model according to the third read voltage level. The initial programming voltage is the first among the programming voltages in the incremental step pulse program model to be applied to the memory cells in the first region. Further, any programming parameters or erasing parameters which are related to adjustment of the initial programming voltage and/or capable of achieving the similar effect may also be adjusted.

It is worth mentioning that, the invention is not intended to limit the preset operation performed according to the third read voltage level to the above. For example, in another exemplary embodiment, any parameters or memory settings which can be correspondingly adjusted according to the performance degradation, the wear degree or the voltage distribution status of the memory cells may all be properly adjusted in response to the estimation of the third read voltage level, so as to improve a management ability of the rewritable non-volatile memory module 406. For example, in an exemplary embodiment, according to the estimated third read voltage level, the physical units belonging to the first region may also be marked as damaged and so on. Further, in an exemplary embodiment, any information that can facilitate the management of the rewritable non-volatile memory module 406 (e.g., an lifetime of the rewritable non-volatile memory module 406) may also be obtained according to the third read voltage level.

It should be note that, although one memory cell storing one bit is used as an example for description in the foregoing exemplary embodiments, however, in another exemplary embodiment, said operation of reading the encoding unit, said operation of decoding the encoding unit and said operation of estimating the read voltage level are also applicable to a usage scenario where one memory cell is capable of storing multiple bits. For example, the estimated read voltage level may also be used to read the data stored in the memory cells operated under the MLC mode or the TLC mode.

Figure 12:
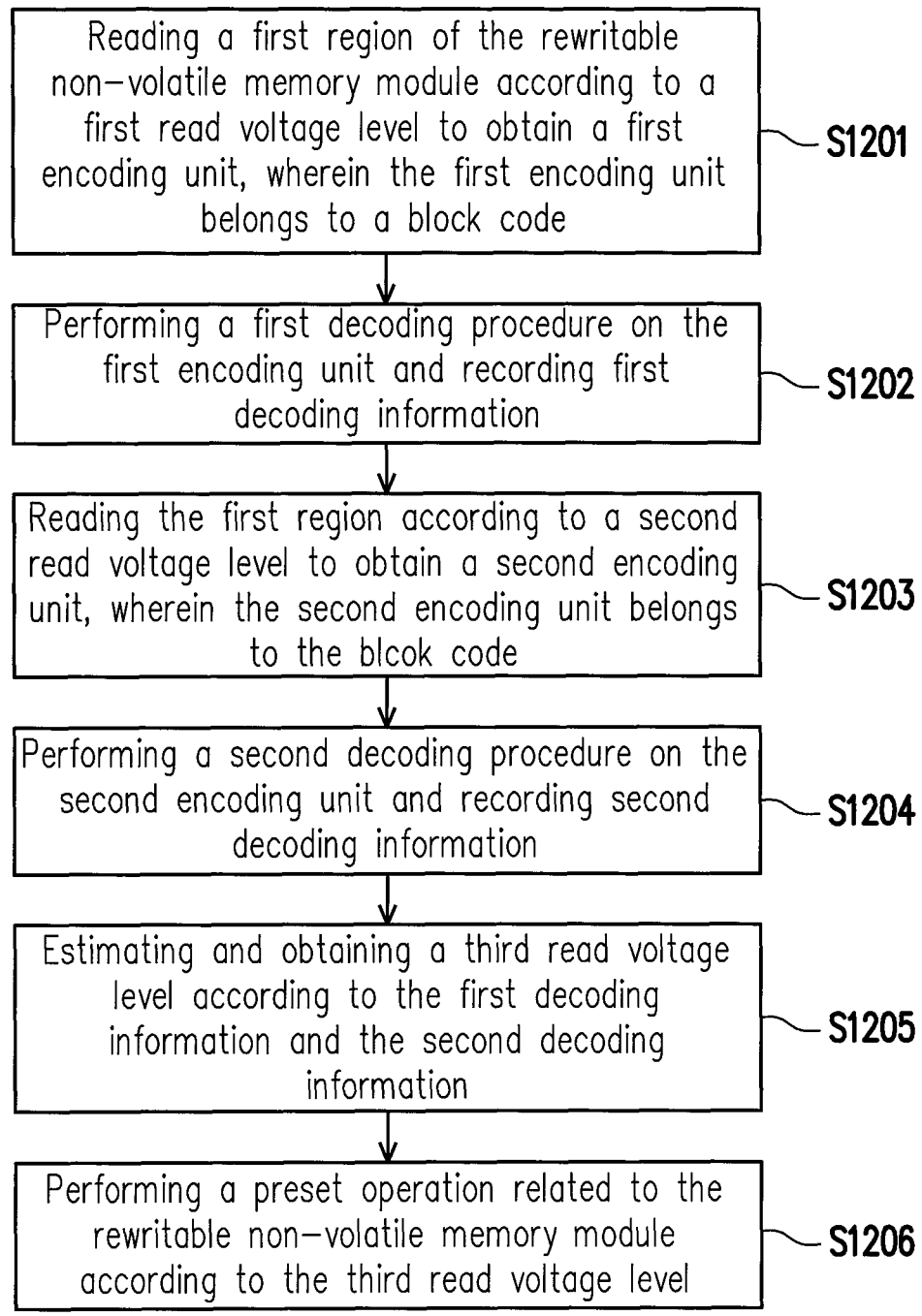
FIG. 12 is a flowchart illustrating a read voltage level estimating method according to an exemplary embodiment of the invention.

FIG. 12 is a flowchart illustrating a read voltage level estimating method according to an exemplary embodiment of the invention.

Referring to FIG. 12, in step S1201, a first region of the rewritable non-volatile memory module is read according to a first read voltage level to obtain a first encoding unit, wherein the first encoding unit belongs to a block code. In step S1202, a first decoding procedure is performed on the first encoding unit and first decoding information is recorded. In step S1203, the first region is read according to a second read voltage level to obtain a second encoding unit, wherein the second encoding unit belongs to the block code. In step S1204, a second decoding procedure is performed on the first encoding unit and second decoding information is recorded. In step S1205, a third read voltage level is estimated and obtained according to the first decoding information and the second decoding information. In step S1206, at least one preset operation related to the rewritable non-volatile memory module is performed according to the third read voltage level.

Nevertheless, steps depicted in FIG. 12 are described in detail as above, thus related description is omitted hereinafter. It should be noted that, the steps depicted in FIG. 12 may be implemented as a plurality of program codes or circuits, which are not particularly limited in the invention. Moreover, the method disclosed in FIG. 12 may be implemented by reference with above exemplary embodiments, or may be implemented separately, which are not particularly limited in the invention.

In summary, after reading the memory by using the different read voltage levels and attempting to decode the obtained data, the decoding information corresponding to the different encoding units are recorded. Later, the decoding information may be used as a reference to estimate for one suitable read voltage level, and at least one preset operation may be performed correspondingly. Accordingly, a management ability of the rewritable non-volatile memory module adopting the block code may be improved.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A read voltage level estimating method for a rewritable non-volatile memory module, the read voltage level estimating method comprising:
reading a first region of the rewritable non-volatile memory module according to a first read voltage level to obtain a first encoding unit, wherein the first encoding unit belongs to a block code;
performing a first decoding procedure on the first encoding unit and recording first decoding information;
reading the first region according to a second read voltage level to obtain a second encoding unit, wherein the second encoding unit belongs to the block code;
performing a second decoding procedure on the second encoding unit and recording second decoding information; and
estimating and obtaining a third read voltage level according to the first decoding information and the second decoding information.

2. The read voltage level estimating method of claim 1, wherein the block code is composed of a plurality of sub encoding units, wherein a first bit of the sub encoding units is determined by a plurality of encoding procedures.

3. The read voltage level estimating method of claim 2, wherein the encoding procedures are based on different encoding directions.

4. The read voltage level estimating method of claim 1, wherein the first decoding information comprises a first value, wherein the second decoding information comprises a second value,
wherein the step of estimating and obtaining the third read voltage level according to the first decoding information and the second decoding information comprises:
comparing the first value and the second value and determining the third read voltage level according to a comparison result.

5. The read voltage level estimating method of claim 4, wherein the first value is related to a first decoding result of the first decoding procedure, wherein the second value is related to a second decoding result of the second decoding procedure.

6. The read voltage level estimating method of claim 5, wherein the first value is positively correlated to a first decoding success unit count of the first decoding procedure, wherein the second value is positively correlated to a second decoding success unit count of the second decoding procedure.

7. The read voltage level estimating method of claim 6, further comprising:
obtaining a first row decoding success unit count and a first column decoding success unit count according to the first decoding result;
determining the first value according to the first row decoding success unit count and the first column decoding success unit count;
obtaining a second row decoding success unit count and a second column decoding success unit count according to the second decoding result; and
determining the second value according to the second row decoding success unit count and the second column decoding success unit count.

8. The read voltage level estimating method of claim 1, wherein the step of estimating and obtaining the third read voltage level according to the first decoding information and the second decoding information comprises:
determining one of the first read voltage level and the second read voltage level to be the third read voltage level.

9. The read voltage level estimating method of claim 1, further comprising:
determining whether the first decoding procedure fails,
wherein the step of reading the first region according to the second read voltage level is performed after determining that the first decoding procedure fails.

10. The read voltage level estimating method of claim 1, further comprising:
performing a preset operation related to the rewritable non-volatile memory module according to the third read voltage level,
wherein the preset operation comprises at least one of following operations:
reading the first region to obtain a plurality of soft bits corresponding to a third encoding unit and performing an iteration decoding on the third encoding unit according to the soft bits;
determining a wear degree of a plurality of memory cells in the first region or a voltage distribution status of the memory cells; and
determining a preset programming voltage corresponding to the first region.

11. The read voltage level estimating method of claim 1, further comprising:
reading the first region according to the third read voltage level to obtain a third encoding unit; and
performing a third decoding procedure on the third encoding unit.

12. The read voltage level estimating method of claim 1, wherein each of the first decoding procedure and the second decoding procedure is a hard bit mode decoding.

13. A memory storage device, comprising:
a connection interface unit, configured to couple to a host system;
a rewritable non-volatile memory module; and
a memory control circuit unit, coupled to the connection interface unit and the rewritable non-volatile memory module,
wherein the memory control circuit unit is configured to send a first read command sequence, wherein the first read command sequence is configured to instruct reading a first region of the rewritable non-volatile memory module according to a first read voltage level to obtain a first encoding unit, wherein the first encoding unit belongs to a block code,
wherein the memory control circuit unit is further configured to perform a first decoding procedure on the first encoding unit and record first decoding information,
wherein the memory control circuit unit is further configured to send a second read command sequence, wherein the second read command sequence is configured to instruct reading the first region according to a second read voltage level to obtain a second encoding unit, wherein the second encoding unit belongs to the block code, wherein the memory control circuit unit is further configured to perform a second decoding procedure on the second encoding unit and record second decoding information, wherein the memory control circuit unit is further configured to estimate and obtain a third read voltage level according to the first decoding information and the second decoding information.

14. The memory storage device of claim 13, wherein the block code is composed of a plurality of sub encoding units, wherein a first bit of the sub encoding units is determined by a plurality of encoding procedures.

15. The memory storage device of claim 14, wherein the encoding procedures are based on different encoding directions.

16. The memory storage device of claim 13, wherein the first decoding information comprises a first value, wherein the second decoding information comprises a second value, wherein the operation of the memory control circuit unit for estimating and obtaining the third read voltage level according to the first decoding information and the second decoding information comprises:
comparing the first value and the second value and determining the third read voltage level according to a comparison result.

17. The memory storage device of claim 16, wherein the first value is related to a first decoding result of the first decoding procedure, wherein the second value is related to a second decoding result of the second decoding procedure.

18. The memory storage device of claim 17, wherein the first value is positively correlated to a first decoding success unit count of the first decoding procedure, wherein the second value is positively correlated to a second decoding success unit count of the second decoding procedure.

19. The memory storage device of claim 18, wherein the memory control circuit unit is further configured to obtain a first row decoding success unit count and a first column decoding success unit count according to the first decoding result, wherein the memory control circuit unit is further configured to determine the first value according to the first row decoding success unit count and the first column decoding success unit count, wherein the memory control circuit unit is further configured to obtain a second row decoding success unit count and a second column decoding success unit count according to the second decoding result, wherein the memory control circuit unit is further configured to determine the second value according to the second row decoding success unit count and the second column decoding success unit count.

20. The memory storage device of claim 13, wherein the operation of the memory control circuit unit for estimating and obtaining the third read voltage level according to the first decoding information and the second decoding information comprises:
determining one of the first read voltage level and the second read voltage level to be the third read voltage level.

21. The memory storage device of claim 13, wherein the memory control circuit unit is further configured to determine whether the first decoding procedure fails, wherein the operation of the memory control circuit unit for sending the second read command sequence is performed after determining that the first decoding procedure fails.

22. The memory storage device of claim 13, wherein the memory control circuit unit is further configured to perform a preset operation related to the rewritable non-volatile memory module according to the third read voltage level, wherein the preset operation comprises at least one of following operations:
instructing to read the first region to obtain a plurality of soft bits corresponding to a third encoding unit and perform an iteration decoding on the third encoding unit according to the soft bits;
determining a wear degree of a plurality of memory cells in the first region or a voltage distribution status of the memory cells; and
determining a preset programming voltage corresponding to the first region.

23. The memory storage device of claim 13, wherein the memory control circuit unit is further configured to instruct reading the first region according to the third read voltage level to obtain a third encoding unit, wherein the memory control circuit unit is further configured to perform a third decoding procedure on the third encoding unit.

24. The memory storage device of claim 13, wherein each of the first decoding procedure and the second decoding procedure is a hard bit mode decoding.

25. A memory control circuit unit, configured to control a rewritable non-volatile memory module, the memory control circuit unit comprising:
a host interface, configured to couple to a host system;
a memory interface, configured to couple to the rewritable non-volatile memory module;
an error checking and correcting circuit; and
a memory management circuit, coupled to the host interface, the memory interface, and the error checking and correcting circuit, wherein the memory management circuit is configured to send a first read command sequence, wherein the first read command sequence is configured to instruct reading a first region of the rewritable non-volatile memory module according to a first read voltage level to obtain a first encoding unit, wherein the first encoding unit belongs to a block code, wherein the error checking and correcting circuit is configured to perform a first decoding procedure on the first encoding unit and the memory management circuit is further configured to record first decoding information, wherein the memory management circuit is further configured to send a second read command sequence, wherein the second read command sequence is configured to instruct reading the first region according to a second read voltage level to obtain a second encoding unit, wherein the second encoding unit belongs to the block code, wherein the error checking and correcting circuit is further configured to perform a second decoding procedure on the second encoding unit and the memory management circuit is further configured to record second decoding information, wherein the memory management circuit is further configured to estimate and obtain a third read voltage level according to the first decoding information and the second decoding information.

26. The memory control circuit unit of claim 25, wherein the block code is composed of a plurality of sub encoding units, and a first bit of the sub encoding units is determined by a plurality of encoding procedures.

27. The memory control circuit unit of claim 26, wherein the encoding procedures are based on different encoding directions.

28. The memory control circuit unit of claim 25, wherein the first decoding information comprises a first value, wherein the second decoding information comprises a second value,
- wherein the operation of the memory management circuit for estimating and obtaining the third read voltage level according to the first decoding information and the second decoding information comprises:
- comparing the first value and the second value and determining the third read voltage level according to a comparison result.

29. The memory control circuit unit of claim 28, wherein the first value is related to a first decoding result of the first decoding procedure, wherein the second value is related to a second decoding result of the second decoding procedure.

30. The memory control circuit unit of claim 29, wherein the first value is positively correlated to a first decoding success unit count of the first decoding procedure, wherein the second value is positively correlated to a second decoding success unit count of the second decoding procedure.

31. The memory control circuit unit of claim 30, wherein the memory management circuit is further configured to obtain a first row decoding success unit count and a first column decoding success unit count according to the first decoding result,
- wherein the memory management circuit is further configured to determine the first value according to the first row decoding success unit count and the first column decoding success unit count,
- wherein the memory management circuit is further configured to obtain a second row decoding success unit count and a second column decoding success unit count according to the second decoding result,
- wherein the memory management circuit is further configured to determine the second value according to the second row decoding success unit count and the second column decoding success unit count.

32. The memory control circuit unit of claim 25, wherein the operation of the memory management circuit for estimating and obtaining the third read voltage level according to the first decoding information and the second decoding information comprises:
- determining one of the first read voltage level and the second read voltage level to be the third read voltage level.

33. The memory control circuit unit of claim 25, wherein the memory management circuit is further configured to determine whether the first decoding procedure fails,
- wherein the operation of the memory management circuit for sending the second read command sequence is performed after determining that the first decoding procedure fails.

34. The memory control circuit unit of claim 25, wherein the memory management circuit is further configured to perform a preset operation related to the rewritable non-volatile memory module according to the third read voltage level,
- wherein the preset operation comprises at least one of following operations:
- instructing to read the first region to obtain a plurality of soft bits corresponding to a third encoding unit and perform an iteration decoding on the third encoding unit according to the soft bits by the error checking and correcting circuit;
- determining a wear degree of a plurality of memory cells in the first region or a voltage distribution status of the memory cells; and
- determining a preset programming voltage corresponding to the first region.

35. The memory control circuit unit of claim 25, wherein the memory management circuit is further configured to instruct reading the first region according to the third read voltage level to obtain a third encoding unit,
- wherein the error checking and correcting circuit is further configured to perform a third decoding procedure on the third encoding unit.

36. The memory control circuit unit of claim 25, wherein each of the first decoding procedure and the second decoding procedure is a hard bit mode decoding.

* * * * *